United States Patent
Kawahara

[19]

[11] Patent Number: 6,150,284

[45] Date of Patent: Nov. 21, 2000

[54] METHOD OF FORMING AN ORGANIC POLYMER INSULATING FILM IN A SEMICONDUCTOR DEVICE

[75] Inventor: Jun Kawahara, Tokyo, Japan

[73] Assignee: NEC Corporation, Tokyo, Japan

[21] Appl. No.: 09/102,052

[22] Filed: Jun. 22, 1998

[30] Foreign Application Priority Data

Jun. 20, 1997 [JP] Japan .................................. 9-164688

[51] Int. Cl.[7] .............................................. H01L 21/31
[52] U.S. Cl. .......................... 438/780; 438/80; 437/100; 437/430
[58] Field of Search .................... 438/780, 80; 437/100, 437/430

[56] References Cited

U.S. PATENT DOCUMENTS

| | | | |
|---|---|---|---|
| 5,079,221 | 1/1992 | Morohashi | 505/1 |
| 5,284,779 | 2/1994 | Miyanaga | 437/1 |
| 5,415,889 | 5/1995 | Nakayama et al. | 427/430 |

FOREIGN PATENT DOCUMENTS

| | | |
|---|---|---|
| 64-36031 | 2/1989 | Japan . |
| 4-180552 | 6/1992 | Japan . |
| 6-112336 | 4/1994 | Japan . |
| 9-115898 | 5/1997 | Japan . |
| 9-283513 | 10/1997 | Japan . |
| 10-92800 | 4/1998 | Japan . |
| 10-113610 | 5/1998 | Japan . |

OTHER PUBLICATIONS

J. Wary et al., "Vacuum–Deposited Parylene AF–4 : A Thermally Stable, Low Dielectric Constant Polymer For Interlayer Dielectric Use", pp. 207–213, DUMIC Conference, Feb. 20–21, 1996.

M.R. Schneider, "A Multilayer Interconnect Process for VLSI GaAs ICs Employing Polyimide Interlayer Dielectrics", pp. 93–99, VMIC Conference, Jun. 9–10, 1992.

*Primary Examiner*—David Nelms
*Assistant Examiner*—Pho Luy
*Attorney, Agent, or Firm*—Young & Thompson

[57] ABSTRACT

A method of forming an organic polymer insulator in a semiconductor device comprises the step of causing a thermal polymerization of at least one kind of monomers and oligomers supplied in vapor phase.

71 Claims, 5 Drawing Sheets

METHOD OF FORMING AN ORGANIC POLYMER INSULATING FILM IN A SEMICONDUCTOR DEVICE

BACKGROUND OF THE INVENTION

The present invention relates to a method of forming an organic polymer insulating film in a semiconductor device.

The requirement for further shrinkage of feature size of semiconductor devices integrated in a semiconductor integrated circuit has been on the increase in accordance with semiconductor integrated circuit design rule. Such further scaling down of the semiconductor devices raises serious problems with resistance of interconnections and parasitic capacitance between the interconnections. Namely, a problem with delay in transmission of signals on interconnections in the semiconductor integrated circuit is raised. In order to solve the problem with the signal transmission delay, it is effective to reduce a dielectric constant of the inter-layer insulator between the interconnections. An organic insulating film has been known as a dielectric film having a low dielectric constant, for which reason the organic insulating film be attractive as the inter-layer insulator In prior art, the organic insulating film was formed by a spin coating method.

One of typical spin coating methods is disclosed in Mark R. Schneider, VLSI Multilevel Interconnect Conference June 1992, pp. 93–99, entitled "A Multilayer Interconnect Process For VLSI GaAs ICs Employing Polyimide Inter-layer Dielectrics". This spin coating method will be described as follows.

In accordance with the spin coating method, a coating solution is first spin-coated on a base layer wherein the coating solution comprises a mixture of a source for growing a film with a solvent. Thereafter, a process for evaporation of the solvent is carried out. Subsequently, a curing process for the spin-coated film is carried out. An adhesion promoter may be, if necessary, coated on the base layer and subsequently baked, before the coating solution is spin-coated in order to ensure a good adhesion at an interface of the base layer.

Consequently, if the spin-coating method is used to form an organic insulating film, then at least three steps are necessary, for example, the spin-coating process for spin-coating the coating solution, the evaporation process for evaporating a solvent and the curing process. This spin-coating method, however, has the following four problems.

The first problem is concerned with many necessary processes and time-consuming method. As described above, at least three processes are necessary. Further, there may be added further processes for coating an adhesion promoter and subsequent backing thereof. Furthermore, the curing process requires a complicated temperature control. Namely, the necessary temperature profile of the curing process is complicated.

The second problem is concerned with a difficulty in accurate control to a thickness of the film. In accordance with the spin-coating method, the control to the thickness of the film is made by depending upon a viscosity of the coating solution and a rotation speed. An extremely high viscosity of the coating solution makes it difficult to form a thin film. By contrast, an extremely low viscosity of the coating solution makes it difficult to form a thick film.

The third problem is concerned with the use of a solvent to control the thickness of the film. The used solvent is required to be completely removed. Actually, however, it is difficult to remove the solvent completely and a small amount of the solvent is likely to remain in the film. In this case, the remaining solvent in the film may be evaporated, for example, in the post-process whereby voids and pinholes are formed in the film.

The fourth problem is concerned with generation of by-product in the process for forming an insulating film. This problem is serious particularly when polyimide is used. This problem is independent from the issue of whether or not the spin-coating method is carried out. During a reaction for forming imide rings, water is generated as by-product. Water or moisture remains in the film and may be evaporated from the inside of the film whereby voids and pinholes are formed in the film.

In the above circumstances, it had been required to develop a novel method of an organic insulating film free from the above first to fourth problems.

SUMMARY OF THE INVENTION

Accordingly, it is an object of the present invention to provide a novel method of forming an organic polymer insulating film free from the above problems.

It is a further object of the present invention to provide a novel method of forming an organic polymer insulating film free from a process of elimination of any solvent.

It is a still further object of the present invention to provide a novel method of forming an organic polymer insulating film free from any curing process.

It is yet a further object of the present invention to provide a novel method of forming an organic polymer insulating film having a low dielectric constant.

It is a further more object of the present invention to provide a novel method of forming an organic polymer insulating film with a reduced number of steps.

It is still more object of the present invention to provide a novel method of forming an organic polymer insulating film allowing an accurate control of a growth rate.

It is moreover object of the present invention to provide a novel method of forming an organic polymer insulating film allowing an accurate control of a thickness thereof.

It is another object of the present invention to provide a novel method of forming an organic polymer insulating film without generation of any by-product.

It is still another object of the present invention to provide a novel method of forming an organic polymer insulating film free of any void or pin hole.

It is yet another object of the present invention to provide a novel method of forming an organic polymer insulating film having a high conformability with a shape of a base layer on which the organic polymer insulating film is formed.

It is further another object of the present invention to provide a novel method of forming an organic polymer inter-layer insulator in a semiconductor device, wherein said organic polymer inter-layer insulator reduces a parasitic capacitance between interconnections.

It is an additional object of the present invention to provide a novel method of forming an organic polymer inter-layer insulator in a semiconductor device in a large scale integrated circuit, wherein said organic polymer inter-layer insulator allows the large scale integrated circuit to exhibit high speed performances.

It is a still additional object of the present invention to provide a novel method of forming an organic polymer inter-layer insulator in a semiconductor device in a large scale integrated circuit, wherein said organic polymer inter-layer insulator allows an increase in density of integration of the large scale integrated circuit.

It is yet an additional object of the present invention to provide a novel method of forming an organic polymer inter-layer insulator in a semiconductor device in a large scale integrated circuit, wherein said organic polymer inter-layer insulator allows an increased freedom on designing the large scale integrated circuit.

The above and other objects, features and advantages of the present invention will be apparent from the following descriptions.

The present invention provides a method of forming an organic polymer insulator. The method comprises the step of causing a thermal polymerization of at least one kind of monomers and oligomers supplied in vapor phase.

In accordance with the above present invention, a thermal polymerization reaction of at least one kind of monomers and oligomers results in a growth of the organic polymer insulator, for which reason no curing process for the insulator is required.

Since, further, at least one kind of monomers and oligomers is supplied in vapor phase for subsequent polymerization reaction thereof, no removal nor elimination of any solvent is required.

As described above, the above novel method is simple and not complicated.

The supply in vapor phase of at least one kind of monomers and oligomers allows a growth rate of the organic polymer insulator to be accurately controlled by controlling an amount of supplied source or at least one kind of monomers and oligomers and a temperature in the polymerization process.

The use of the above novel method results in no generation of gases from the insulator. The use of the above novel method also results in a formation of the organic polymer insulator with a low dielectric constant. For this reason, if the organic polymer insulator is used in a semiconductor device, then many advantages are provided such as a reduced parasitic capacitance between interconnections. This organic polymer insulator allows the semiconductor device such as LSI circuits to exhibit high speed performances. This organic polymer insulator also allows a further increase in density of integration of the semiconductor device. This allows an increased freedom on design of the semiconductor device.

Consequently, the above novel method for forming the organic polymer insulator utilizes a thermal polymerization of at least one kind of monomers and oligomers which has been supplied in vapor phase. This is quite different from the well known thermal chemical vapor deposition which utilizes a deposition process of source gases for insulator in the form of molecules or atoms. The chemical vapor deposition utilizes no polymerization of monomers or oligomers nor supply in vapor phase of the monomers or oligomers.

In addition, since the growth of the organic polymer insulator is progressed by the polymerization reaction on a base, the organic polymer insulator has a high conformability with a shape of the base.

BRIEF DESCRIPTION OF THE DRAWINGS

Preferred embodiments according to the present invention will be described in detail with reference to the accompanying drawings.

DISCLOSURE OF THE INVENTION

Figure 1:
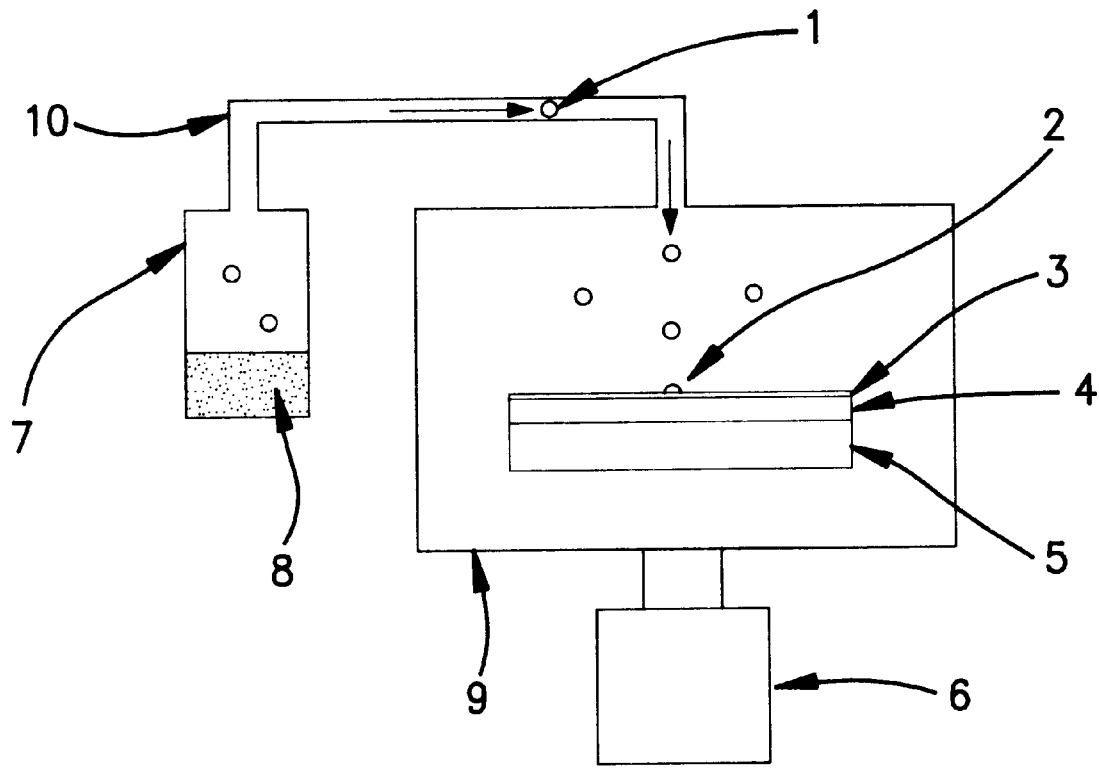
FIG. 1 is a schematic diagram illustrative of an apparatus to be used for forming an organic polymer insulating film in accordance with a novel method of the below first to fifth present inventions.

The first present invention provides a method of forming an organic polymer insulator. The method comprises the step of causing a thermal polymerization of at least one kind of monomers and oligomers supplied in vapor phase.

In accordance with the above first present invention, a thermal polymerization reaction of at least one kind of monomers and oligomers results in a growth of the organic polymer insulator, for which reason no curing process for the insulator is required.

Since, further, at least one kind of monomers and oligomers is supplied in vapor phase for subsequent polymerization reaction thereof, no removal nor elimination of any solvent is required.

As described above, the above novel method is simple and not complicated.

The supply in vapor phase of at least one kind of monomers and oligomers allows a growth rate of the organic polymer insulator to be accurately controlled by controlling an amount of supplied source or at least one kind of monomers and oligomers and a temperature in the polymerization process.

The use of the above novel method results in no generation of gases from the insulator. The use of the above novel method also results in a formation of the organic polymer insulator with a low dielectric constant. For this reason, if the organic polymer insulator is used in a semiconductor device, then many advantages are provided such as a reduced parasitic capacitance between interconnections. This organic polymer insulator allows the semiconductor device such as LSI circuits to exhibit high speed performances. This organic polymer insulator also allows a further increase in density of integration of the semiconductor device. This allows an increased freedom on design of the semiconductor device.

Consequently, the above novel method for forming the organic polymer insulator utilizes a thermal polymerization of at least one kind of monomers and oligomers which has been supplied in vapor phase. This is quite different from the well known thermal chemical vapor deposition which utilizes a deposition process of source gases for insulator in the form of molecules or atoms. The chemical vapor deposition utilizes no polymerization of monomers or oligomers nor supply in vapor phase of the monomers or oligomers.

In addition, since the growth of the organic polymer insulator is progressed by the polymerization reaction on a base, the organic polymer insulator has a high conformability with a shape of the base.

It is preferable that the above at least one kind of monomers and oligomers has a first structure capable of having at least two double bonds and a second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulator. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is further preferable that one kind of the monomers and oligomers is polymerized and the one kind of the monomers and oligomers includes both the first structure capable of having at least two double bonds and the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulator. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

Alternatively, it is further preferable that plural kinds of the monomers and oligomers are polymerized and the plural kinds of the monomers and oligomers include both the first structure capable of having at least two double bonds and the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulator. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is further preferable that a first kind of the monomers and oligomers includes the first structure capable of having at least two double bonds and a second kind of the monomers and oligomers includes the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulator. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is furthermore preferable that the first kind of the monomers and oligomers comprises a diene having two double bonds, and the second kind of the monomers and oligomers comprises a dienophile having one double bond.

It is also preferable that the double bond is a conjugated double bond.

In the above case, it is further preferable that the monomer is selected from the group consisting of substances having at least one benzocyclobutene structure and derivatives thereof, and the oligomer is obtainable from the monomers. An ring-opening reaction is caused by an energy such as a thermal energy so that a cyclo-ring of the benzocyclobutene structure is opened to have two double bonds before a polymerization reaction is caused by a further energy supply between the benzocyclobutene structure with a substance having one double bond thereby to form an organic polymer. This process is illustrated as follows.

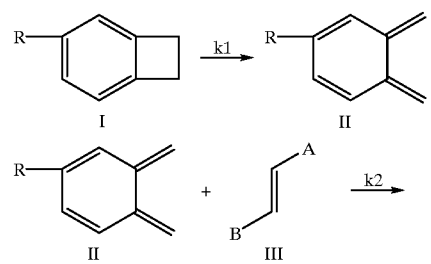

-continued

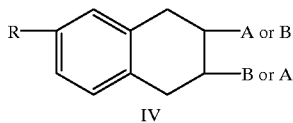

IV where k1 and k2 are reaction rate constants.

It is also preferable that the thermal polymerization is caused at a temperature in the range of 200–400° C.

It is also preferable that the thermal polymerization is caused under a pressure in the range of 10–1000 mTorr.

It is also preferable that the thermal polymerization is caused for a time in the range of 30 seconds to 10 minutes.

It is also preferable that a rate of supplying the at least one kind of monomers and the oligomers in vapor phase is in the range of 0.01 to 1 g/min.

The above polymerization conditions are, however, dependent upon kinds of the monomers and oligomers.

As described above, the monomer or oligomer is fed in vapor phase onto a position where polymerization reaction is intended to be caused. If the monomer or oligomer is a liquid, it is necessary to vaporize the monomer or oligomer by a heating process or by a combination of a heating process with an inert gas blow before feeding the same in vapor phase. Alternatively, a low pressure heating process and a combination of a low pressure heating process with a an inert gas blow are also available to vaporize the monomer or oligomer. If, during the feed of the monomer or oligomer, there is a certain possibility of condensation of the monomer or oligomer once vaporized, it is preferable to use a transport gas to prevent the condensation of the monomer or oligomer.

The second present invention provides a method of forming an organic polymer insulating film on a solid. The method comprises the step of supplying at least one kind of monomers and oligomers in vapor phase onto a surface of the solid which is heated so as to cause a thermal polymerization of the at least one kind of monomers and oligomers on the surface of the solid.

In accordance with the above second present invention, a thermal polymerization reaction of at least one kind of monomers and oligomers results in a growth of the organic polymer insulating film on a solid, for which reason no curing process for the insulator is required.

Since, further, at least one kind of monomers and oligomers is supplied in vapor phase for subsequent polymerization reaction thereof, no removal nor elimination of any solvent is required.

As described above, the above novel method is simple and not complicated.

The supply in vapor phase of at least one kind of monomers and oligomers allows a growth rate of the organic polymer insulating film on the solid to be accurately controlled by controlling an amount of supplied source or at least one kind of monomers and oligomers and a temperature of a surface of the solid during the polymerization process. Further, a thickness of the organic polymer insulating film is accurately controllable by controlling an amount of supplied source or at least one kind of monomers and oligomers and a temperature of a surface of the solid during the polymerization process in addition a time of the polymerization.

The use of the above novel method results in no generation of gases from the insulating film. The use of the above novel method also results in a formation of the organic polymer insulating film with a low dielectric constant. For this reason, if the organic polymer insulator is used in a semiconductor device, then many advantages are provided such as a reduced parasitic capacitance between interconnections. This organic polymer insulating film allows the semiconductor device such as LSI circuits to exhibit high speed performances. This organic polymer insulating film also allows a further increase in density of integration of the semiconductor device. This allows an increased freedom on design of the semiconductor device.

Consequently, the above novel method for forming the organic polymer insulating film utilizes a thermal polymerization of at least one kind of monomers and oligomers which has been supplied in vapor phase. This is quite different from the well known thermal chemical vapor deposition which utilizes a deposition process of source gases for insulator in the form of molecules or atoms. The chemical vapor deposition utilizes no polymerization of monomers or oligomers nor supply in vapor phase of the monomers or oligomers.

In addition, since the growth of the organic polymer insulating film is progressed by the polymerization reaction on the solid, the organic polymer insulating film has a high conformability with a shape of the solid.

It is preferable that the at least one kind of monomers and oligomers has a first structure capable of having at least two double bonds and a second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is further preferable that one kind of the monomers and oligomers is supplied in vapor phase for the thermal polymerization thereof, and the one kind of the monomers and oligomers includes both the first structure capable of having at least two double bonds and the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

Alternatively, it is further preferable that plural kinds of the monomers and oligomers are supplied in vapor phase for the thermal polymerization thereof, and the plural kinds of the monomers and oligomers include both the first structure capable of having at least two double bonds and the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is furthermore preferable that a first kind of the monomers and oligomers includes the first structure capable of having at least two double bonds and a second kind of the monomers and oligomers includes the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is moreover preferable that the first kind of the monomers and oligomers comprises a diene having two double bonds, and the second kind of the monomers and oligomers comprises a dienophile having one double bond.

In is further preferable that the double bond is a conjugated double bond.

In the above case, it is further preferable that the monomer is selected from the group consisting of substances having at least one benzocyclobutene structure and derivatives thereof, and the oligomer is obtainable from the monomers. An ring-opening reaction is caused by an energy such as a thermal energy so that a cyclo-ring of the benzocyclobutene structure is opened to have two double bonds before a polymerization reaction is caused by a further energy supply between the benzocyclobutene structure with a substance having one double bond thereby to form an organic polymer. This process is illustrated as follows.

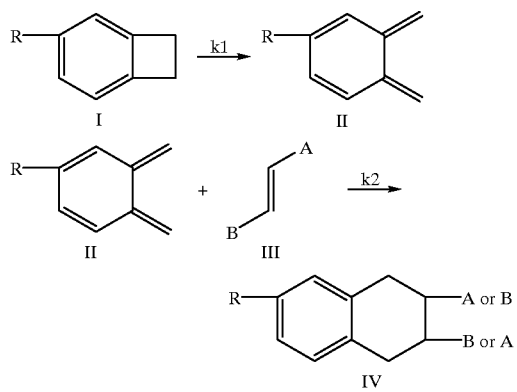

where k1 and k2 are reaction rate constants.

It is also preferable that the thermal polymerization is caused at a temperature in the range of 200–400° C.

It is also preferable that the thermal polymerization is caused under a pressure in the range of 10–1000 mTorr.

It is also preferable that the thermal polymerization is caused for a time in the range of 30 seconds to 10 minutes.

It is also preferable that a rate of supplying the at least one kind of monomers and the oligomers in vapor phase is in the range of 0.01 to 1 g/min.

The above polymerization conditions are, however, dependent upon kinds of the monomers and oligomers.

As described above, the monomer or oligomer is fed in vapor phase onto a position where polymerization reaction is intended to be caused. If the monomer or oligomer is a liquid, it is necessary to vaporize the monomer or oligomer by a heating process or by a combination of a heating process with an inert gas blow before feeding the same in vapor phase. Alternatively, a low pressure heating process and a combination of a low pressure heating process with a an inert gas blow are also available to vaporize the monomer or oligomer. If, during the feed of the monomer or oligomer, there is a certain possibility of condensation of the monomer or oligomer once vaporized, it is preferable to use a transport gas to prevent the condensation of the monomer or oligomer.

It is also preferable that the solid comprises a semiconductor.

It is also preferable that the solid comprises a metal.

It is also preferable that the solid comprises an alloy.

It is also preferable that the solid comprises an insulator,

It is also preferable that the solid comprises a metal silicide.

The third present invention provides a method of forming an organic polymer insulating film over a substrate which is in one of processes for fabricating a semiconductor device. The method comprises the step of supplying at least one kind of monomers and oligomers in vapor phase onto a surface of the substrate which is heated so as to cause a thermal polymerization of the at least one kind of monomers and oligomers on the surface of the substrate.

In accordance with the above third present invention, a thermal polymerization reaction of at least one kind of monomers and oligomers results in the growth of the organic polymer insulating film on the surface of the substrate, for which reason no curing process for the insulator is required.

Since, further, at least one kind of monomers and oligomers is supplied in vapor phase for subsequent polymerization reaction thereof, no removal nor elimination of any solvent is required.

As described above, the above novel method is simple and not complicated.

The supply in vapor phase of at least one kind of monomers and oligomers allows a growth rate of the organic polymer insulating film on the surface of the substrate to be accurately controlled by controlling an amount of supplied source or at least one kind of monomers and oligomers and a temperature of the surface of the substrate during the polymerization process. This means that the above novel method allows an accurate control in thickness of the organic polymer insulating film. Further, a thickness of the organic polymer insulating film is accurately controllable by controlling an amount of supplied source or at least one kind of monomers and oligomers and a temperature of a surface of the solid during the polymerization process in addition a time of the polymerization.

The use of the above novel method results in no generation of gases from the insulating film. The use of the above novel method also results in a formation of the organic polymer insulating film with a low dielectric constant. For this reason, if the organic polymer insulator is used in a semiconductor device, then many advantages are provided such as a reduced parasitic capacitance between interconnections. This organic polymer insulating film allows the semiconductor device such as LSI circuits to exhibit high speed performances. This organic polymer insulating film also allows a further increase in density of integration of the semiconductor device. This allows an increased freedom on design of the semiconductor device.

Consequently, the above novel method for forming the organic polymer insulating film utilizes a thermal polymerization of at least one kind of monomers and oligomers which has been supplied in vapor phase. This is quite different from the well known thermal chemical vapor deposition which utilizes a deposition process of source gases for insulator in the form of molecules or atoms. The chemical vapor deposition utilizes no polymerization of monomers or oligomers nor supply in vapor phase of the monomers or oligomers.

In addition, since the growth of the organic polymer insulating film is progressed by the polymerization reaction on the surface of the substrate, the organic polymer insulating film has a high conformability with a shape of the surface of the substrate.

It is preferable that the at least one kind of monomers and oligomers has a first structure capable of having at least two double bonds and a second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is further preferable that one kind of the monomers and oligomers is supplied in vapor phase for the thermal polymerization thereof, and the one kind of the monomers and oligomers includes both the first structure capable of having at least two double bonds and the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

Alternatively, it is further preferable that plural kinds of the monomers and oligomers are supplied in vapor phase for the thermal polymerization thereof, and the plural kinds of the monomers and oligomers include both the first structure capable of having at least two double bonds and the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is furthermore preferable that a first kind of the monomers and oligomers includes the first structure capable of having at least two double bonds and a second kind of the monomers and oligomers includes the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is moreover preferable that the first kind of the monomers and oligomers comprises a diene having two double bonds, and the second kind of the monomers and oligomers comprises a dienophile having one double bond.

It is also preferable that the double bond is a conjugated double bond.

In the above case, it is further preferable that the monomer is selected from the group consisting of substances having at least one benzocyclobutene structure and derivatives thereof, and the oligomer is obtainable from the monomers. An ring-opening reaction is caused by an energy such as a thermal energy so that a cyclo-ring of the benzocyclobutene structure is opened to have two double bonds before a polymerization reaction is caused by a further energy supply between the benzocyclobutene structure with a substance having one double bond thereby to form an organic polymer. This process is illustrated as follows.

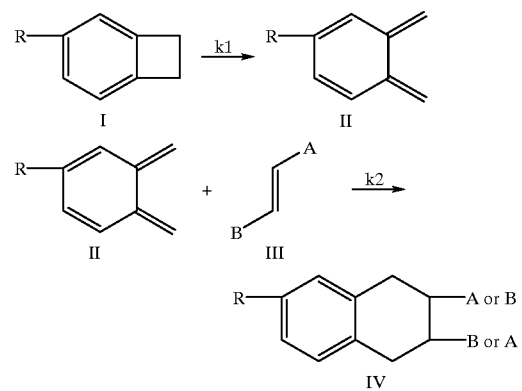

where k1 and k2 are reaction rate constants.

It is also preferable that the thermal polymerization is caused at a temperature in the range of 200–400° C.

It is also preferable that the thermal polymerization is caused under a pressure in the range of 10–1000 mTorr.

It is also preferable that the thermal polymerization is caused for a time in the range of 30 seconds to 10 minutes.

It is also preferable that a rate of supplying the at least one kind of monomers and the oligomers in vapor phase is in the range of 0.01 to 1 g/min.

The above polymerization conditions are, however, dependent upon kinds of the monomers and oligomers.

As described above, the monomer or oligomer is fed in vapor phase onto a position where polymerization reaction is intended to be caused. If the monomer or oligomer is a liquid, it is necessary to vaporize the monomer or oligomer by a heating process or by a combination of a heating process with an inert gas blow before feeding the same in vapor phase. Alternatively, a low pressure heating process and a combination of a low pressure heating process with a an inert gas blow are also available to vaporize the monomer or oligomer. If, during the feed of the monomer or oligomer, there is a certain possibility of condensation of the monomer or oligomer once vaporized, it is preferable to use a transport gas to prevent the condensation of the monomer or oligomer.

It is also preferable that a surface of the substrate in the process for fabricating the semiconductor includes a semiconductor region, and the organic polymer insulating film is formed on the semiconductor region.

It is also preferable that a surface of the substrate in the process for fabricating the semiconductor includes a metal region, and the organic polymer insulating film is formed on the metal region.

It is also preferable that a surface of the substrate in the process for fabricating the semiconductor includes an alloy region, and the organic polymer insulating film is formed on the alloy region.

It is also preferable that a surface of the substrate in the process for fabricating the semiconductor includes an insulator region, and the organic polymer insulating film is formed on the insulator region.

It is also preferable that a surface of the substrate in the process for fabricating the semiconductor includes a metal silicide region, and the organic polymer insulating film is formed on the metal silicide region.

The fourth present invention provides a method of forming an organic polymer inter-layer insulator over a substrate for a semiconductor device. A surface of the substrate has a base insulating film and a plurality of interconnections extending on the base insulating film. The method comprises the step of supplying at least one kind of monomers and oligomers in vapor phase onto the surface of the substrate which is heated so as to cause a thermal polymerization of the at least one kind of monomers and oligomers on the surface of the solid.

In accordance with the above fourth present invention, a thermal polymerization reaction of at least one kind of monomers and oligomers results in the growth of the organic polymer inter-layer insulator on the surface of the substrate, for which reason no curing process for the insulator is required.

Since, further, at least one kind of monomers and oligomers is supplied in vapor phase for subsequent polymerization reaction thereof, no removal nor elimination of any solvent is required.

As described above, the above novel method is simple and not complicated.

The supply in vapor phase of at least one kind of monomers and oligomers allows a growth rate of the organic polymer inter-layer insulator on the surface of the substrate to be accurately controlled by controlling an amount of supplied source or at least one kind of monomers and oligomers and a temperature of the surface of the substrate during the polymerization process. This means that the above novel method allows an accurate control in thickness of the organic polymer inter-layer insulator. Further, a thickness of the organic polymer inter-layer insulator is accurately controllable by controlling an amount of supplied source or at least one kind of monomers and oligomers and a temperature of a surface of the solid during the polymerization process in addition a time of the polymerization.

The use of the above novel method results in no generation of gases from the inter-layer insulator. The use of the above novel method also results in a formation of the organic polymer inter-layer insulator with a low dielectric constant. For this reason, if the organic polymer insulator is used in a semiconductor device, then many advantages are provided such as a reduced parasitic capacitance between interconnections. This organic polymer inter-layer insulator allows the semiconductor device such as LSI circuits to exhibit high speed performances. This organic polymer inter-layer insulator also allows a further increase in density of integration of the semiconductor device. This allows an increased freedom on design of the semiconductor device.

Consequently, the above novel method for forming the organic polymer inter-layer insulator utilizes a thermal polymerization of at least one kind of monomers and oligomers which has been supplied in vapor phase. This is quite different from the well known thermal chemical vapor deposition which utilizes a deposition process of source gases for insulator in the form of molecules or atoms. The chemical vapor deposition utilizes no polymerization of monomers or oligomers nor supply in vapor phase of the monomers or oligomers.

In addition, since the growth of the organic polymer inter-layer insulator is progressed by the polymerization reaction on the surface of the substrate, the organic polymer inter-layer insulator has a high conformability with a shape of the surface of the substrate.

It is preferable that the at least one kind of monomers and oligomers has a first structure capable of having at least two double bonds and a second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer inter-layer insulator. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is further preferable that one kind of the monomers and oligomers is supplied in vapor phase for the thermal polymerization thereof, and the one kind of the monomers and oligomers includes both the first structure capable of having at least two double bonds and the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer inter-layer insulator. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

Alternatively, it is further preferable that plural kinds of the monomers and oligomers are supplied in vapor phase for the thermal polymerization thereof, and the plural kinds of the monomers and oligomers include both the first structure capable of having at least two double bonds and the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer inter-layer insulator. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is furthermore preferable that a first kind of the monomers and oligomers includes the first structure capable of having at least two double bonds and a second kind of the monomers and oligomers includes the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer inter-layer insulator. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is moreover preferable that the first kind of the monomers and oligomers comprises a diene having two double bonds, and the second kind of the monomers and oligomers comprises a dienophile having one double bond.

It is further preferable that the double bond is a conjugated double bond.

In the above case, it is further preferable that the monomer is selected from the group consisting of substances having at least one benzocyclobutene structure and derivatives thereof, and the oligomer is obtainable from the monomers. An ring-opening reaction is caused by an energy such as a thermal energy so that a cyclo-ring of the benzocyclobutene structure is opened to have two double bonds before a polymerization reaction is caused by a further energy supply between the benzocyclobutene structure with a substance having one double bond thereby to form an organic polymer. This process is illustrated as follows.

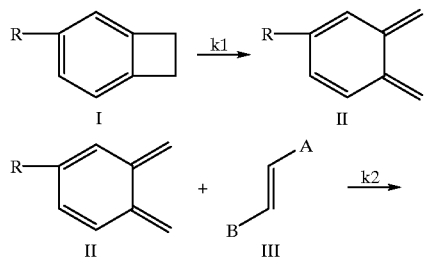

-continued

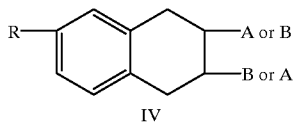

where k1 and k2 are reaction rate constants.

It is also preferable that the thermal polymerization is caused at a temperature in the range of 200–400° C.

It is also preferable that the thermal polymerization is caused under a pressure in the range of 10–1000 mTorr.

It is also preferable that the thermal polymerization is caused for a time in the range of 30 seconds to 10 minutes.

It is also preferable that a rate of supplying the at least one kind of monomers and the oligomers in vapor phase is in the range of 0.01 to 1 g/min.

The above polymerization conditions are, however, dependent upon kinds of the monomers and oligomers.

As described above, the monomer or oligomer is fed in vapor phase onto a position where polymerization reaction is intended to be caused. If the monomer or oligomer is a liquid, it is necessary to vaporize the monomer or oligomer by a heating process or by a combination of a heating process with an inert gas blow before feeding the same in vapor phase. Alternatively, a low pressure heating process and a combination of a low pressure heating process with a an inert gas blow are also available to vaporize the monomer or oligomer. If, during the feed of the monomer or oligomer, there is a certain possibility of condensation of the monomer or oligomer once vaporized, it is preferable to use a transport gas to prevent the condensation of the monomer or oligomer.

It is also preferable that a surface of the substrate in the process for fabricating the semiconductor includes a semiconductor region, and the organic polymer insulating film is formed on the semiconductor region.

It is also preferable to further comprise a step of subjecting the organic insulating inter-layer insulator to an etchback to partially remove the organic insulating inter-layer insulator so that a top surface of the organic insulating inter-layer insulator has a level corresponds to top surfaces of the interconnections.

It is also preferable to further comprise a step of forming a passivation film on the organic insulating inter-layer insulator. This passivation film may comprise a silicon dioxide film which has been formed by a plasma enhanced chemical vapor deposition, a thermal chemical vapor deposition or a sputtering process. A silicon nitride film is also available as the passivation film. This passivation film may act as a cap layer to increase thermal stability when the substrate is heated.

The fifth present invention provides a method of forming an organic polymer insulating film over a substrate which is in one of processes for fabricating a semiconductor device. The substrate is placed on a substrate holder with a heater accommodated in a reaction chamber. The method comprises the step of: vaporizing at least one kind of monomers and oligomers; feeding the at least one kind of monomers and oligomers which is kept in vapor phase into a reaction chamber; and supplying the at least one kind of monomers and oligomers which is kept in vapor phase onto a surface of the substrate which is heated by the heater so as to cause a thermal polymerization of the at least one kind of monomers and oligomers on the surface of the substrate.

In accordance with the above fifth present invention, a thermal polymerization reaction of at least one kind of monomers and oligomers results in the growth of the organic polymer insulating film over the surface of the substrate, for which reason no curing process for the insulator is required.

Since, further, at least one kind of monomers and oligomers is supplied in vapor phase for subsequent polymerization reaction thereof, no removal nor elimination of any solvent is required.

As described above, the above novel method is simple and not complicated.

The supply in vapor phase of at least one kind of monomers and oligomers allows a growth rate of the organic polymer insulating film over the surface of the substrate to be accurately controlled by controlling an amount of supplied source or at least one kind of monomers and oligomers and a temperature of the surface of the substrate during the polymerization process. This means that the above novel method allows an accurate control in thickness of the organic polymer insulating film. Further, a thickness of the organic polymer insulating film is accurately controllable by controlling an amount of supplied source or at least one kind of monomers and oligomers and a temperature of a surface of the solid during the polymerization process in addition a time of the polymerization.

The use of the above novel method results in no generation of gases from the insulating film. The use of the above novel method also results in a formation of the organic polymer insulating film with a low dielectric constant. For this reason, if the organic polymer insulator is used in a semiconductor device, then many advantages are provided such as a reduced parasitic capacitance between interconnections. This organic polymer insulating film allows the semiconductor device such as LSI circuits to exhibit high speed performances. This organic polymer insulating film also allows a further increase in density of integration of the semiconductor device. This allows an increased freedom on design of the semiconductor device.

Consequently, the above novel method for forming the organic polymer insulating film utilizes a thermal polymerization of at least one kind of monomers and oligomers which has been supplied in vapor phase. This is quite different from the well known thermal chemical vapor deposition which utilizes a deposition process of source gases for insulator in the form of molecules or atoms. The chemical vapor deposition utilizes no polymerization of monomers or oligomers nor supply in vapor phase of the monomers or oligomers.

In addition, since the growth of the organic polymer insulating film is progressed by the polymerization reaction on the surface of the substrate, the organic polymer insulating film has a high conformability with a shape of the surface of the substrate.

It is preferable that the at least one kind of monomers and oligomers has a first structure capable of having at least two double bonds and a second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is further preferable that one kind of the monomers and oligomers is supplied in vapor phase for the thermal polymerization thereof, and the one kind of the monomers and oligomers includes both the first structure capable of having at least two double bonds and the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

Alternatively, it is further preferable that plural kinds of the monomers and oligomers are supplied in vapor phase for the thermal polymerization thereof, and the plural kinds of the monomers and oligomers include both the first structure capable of having at least two double bonds and the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is furthermore preferable that a first kind of the monomers and oligomers includes the first structure capable of having at least two double bonds and a second kind of the monomers and oligomers includes the second structure capable of having at least one double bond upon receipt of an energy. In this case, substantially no by-product is generated by the thermal polymerization reaction of the at least one kind of monomers and oligomers. No generation of by-product results in no voids nor pin holes being formed in the organic polymer insulating film. If, for example, the first structure has at least a ring, then an ring-opening reaction is caused by an energy such as a thermal energy so that the ring of the first structure is opened to have two double bonds before a polymerization reaction is caused by a further energy supply between the first structure with the second structure having one double bond thereby to form an organic polymer without generation of by-product.

In the above case, it is moreover preferable that the first kind of the monomers and oligomers comprises a diene having two double bonds, and the second kind of the monomers and oligomers comprises a dienophile having one double bond.

It is also preferable that the double bond is a conjugated double bond.

In the above case, it is further preferable that the monomer is selected from the group consisting of substances having at least one benzocyclobutene structure and derivatives thereof, and the oligomer is obtainable from the monomers. An ring-opening reaction is caused by an energy such as a thermal energy so that a cyclo-ring of the benzocyclobutene structure is opened to have two double bonds before a polymerization reaction is caused by a further energy supply between the benzocyclobutene structure with a substance having one double bond thereby to form an organic polymer. This process is illustrated as follows.

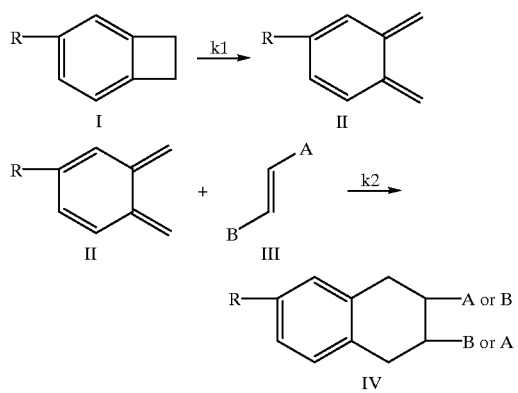

where k1 and k2 are reaction rate constants.

It is also preferable that a substrate temperature is maintained at a temperature in the range of 200–400° C.

It is also preferable that a pressure in the reaction chamber is maintained in the range of 10–1000 mTorr.

It is also preferable that the thermal polymerization is caused for a time in the range of 30 seconds to 10 minutes.

It is also preferable that a rate of feeding the at least one kind of monomers and the oligomers in vapor phase is maintained in the range of 0.01 to 1 g/min.

The above polymerization conditions are, however, dependent upon kinds of the monomers and oligomers.

As described above, the monomer or oligomer is fed in vapor phase onto a position where polymerization reaction is intended to be caused. If the monomer or oligomer is a liquid, it is necessary to vaporize the monomer or oligomer by a heating process or by a combination of a heating process with an inert gas blow before feeding the same in vapor phase. Alternatively, a low pressure heating process and a combination of a low pressure heating process with a an inert gas blow are also available to vaporize the monomer or oligomer. If, during the feed of the monomer or oligomer, there is a certain possibility of condensation of the monomer or oligomer once vaporized, it is preferable to use a transport gas to prevent the condensation of the monomer or oligomer.

Some examples of the monomers and oligomers available in the above novel method in accordance with the first to fifth present inventions are illustrated as follows.

Divinylsiloxane-benzocyclobutene

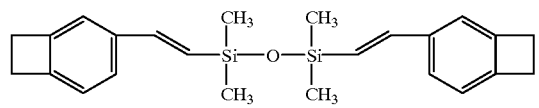

Naphthalene

Naphthalene fluoride

Maleimidebenzocyclobutene

Perphlorocyclobutene aromatic ether

Benzocyclobutene fluoride

Particularly preferable monomers and oligomers available for the above first to fifth present inventions are, for example, compounds having unsaturated hydrocarbon group such as vinyl group on the ring of the benzocyclobutene structure thereof.

Further, the following monomers having at least one benzocyclobutene structure, and derivatives thereof as well as oligomers formed from those monomers and oligomers are, for example, preferable.

Formula 1:

where Q is one selected from the groups illustrated in the following formulae 2 to 12.

Formula 2:

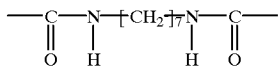

Formula 3:

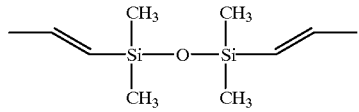

Formula 4:

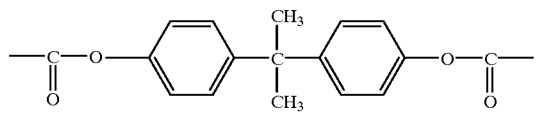

Formula 5:

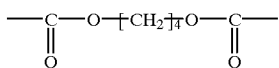

Formula 6:

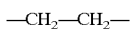

Formula 7:

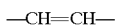

Formula 8:

Formula 9:

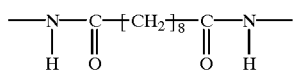

Formula 10:

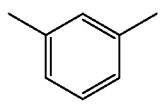

Formula 11:

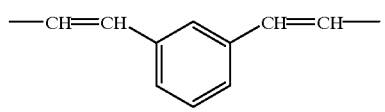

Formula 12:

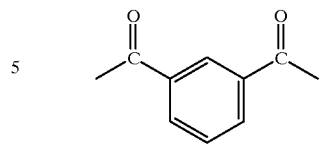

The above novel method of forming the organic polymer insulating film in accordance with the above first to fifth present inventions may be carried out by use of an apparatus as illustrated in FIG. 1.

A reaction chamber 9 accommodates a substrate holder 5 with a heater. A semiconductor substrate 4 is placed on the substrate holder 5 with the heater so that the semiconductor substrate 4 is heated at a temperature, for example, in the range of 200–400° C. The reaction chamber 9 is connected to a discharge pump system 6 for discharging gases in the reaction chambers so that a pressure in the reaction chamber 9 is reduced to, for example, in the range of 10–1000 mTorr. A vaporizer 7 is also connected through a feeding system 10 to the reaction chamber 9. The vaporizer 7 is capable of vaporizing a liquid monomer or oligomer 8 so that a vaporized monomer or oligomer 1 is fed in vapor phase through the feeding system 10 into the top of the reaction chamber 9. The fed monomer or oligomer 1 in vapor phase is fallen onto a surface of the semiconductor substrate 4 on the substrate holder 5 already heated up to the temperature in the range of 200–400° C. When the monomer or oligomer 1 in vapor phase reaches onto the surface of the semiconductor substrate 4, a polymerization reaction of the monomer or oligomer 1 is caused on the surface of the semiconductor substrate 4 to form an organic polymer insulator 2 on the surface of the semiconductor substrate 4. As a result, an organic polymer insulating film 3 is grown on the surface of the semiconductor substrate 4.

Figure 2:
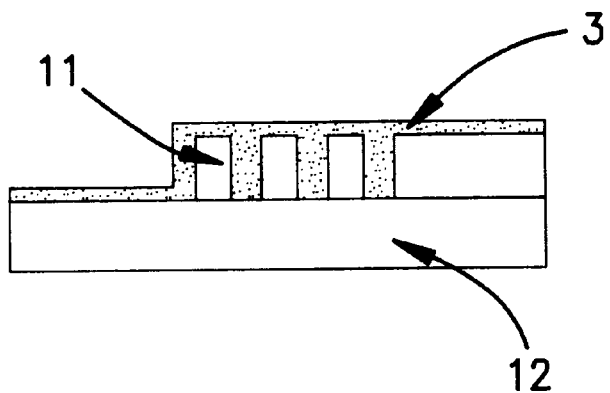
FIG. 2 is a fragmentary cross sectional elevation view illustrative of one example of the below fourth present invention wherein an organic polymer inter-layer insulator is formed on interconnections and a base insulating film.

FIG. 2 is a fragmentary cross sectional elevation view illustrative of one example of the above fourth present invention wherein an organic polymer inter-layer insulator is formed on interconnections and a base insulating film.

With reference to FIG. 2, interconnections 11 are formed on a top surface of the base insulating film 12 so that the interconnections 11 are separated from each other by apertures. An organic polymer inter-layer insulator 3 is formed by utilizing a thermal polymerization of monomer or oligomer in accordance with the above described novel method of the present invention. The base insulating film 12 has been formed on a semiconductor substrate which is not illustrated. The thermal polymerization process is carried out by use of the apparatus illustrated in FIG. 1. As a result of the thermal polymerization reaction, the organic polymer inter-layer insulator 3 is formed which extends over the interconnections 11 and within the apertures between the interconnections 11 as well as over the base insulating film 12. The apertures between the interconnections 11 are completely filled with the organic polymer inter-layer insulator 3. Since the organic polymer inter-layer insulator 3 is grown by the polymerization reaction, no void nor pin hole is formed.

Figure 3A:
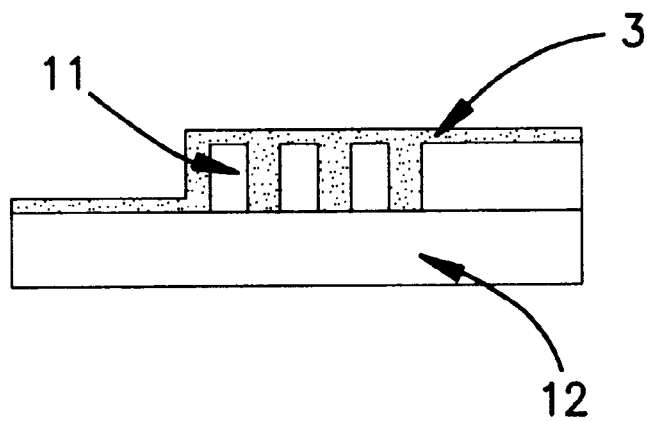
FIGS. 3A and 3B are fragmentary cross sectional elevation views illustrative of another example of the below fourth present invention wherein an organic polymer inter-layer insulator is formed on interconnections and a base insulating film.
Figure 3B:
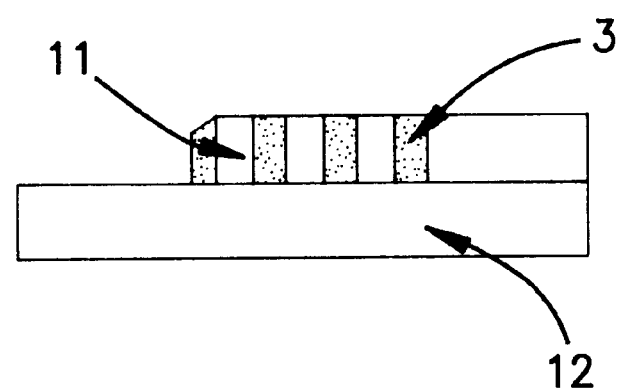

FIGS. 3A and 3B are fragmentary cross sectional elevation views illustrative of another example of the above fourth present invention wherein an organic polymer inter-layer insulator is formed on interconnections and a base insulating film.

With reference to FIG. 3A, interconnections 11 are formed on a top surface of the base insulating film 12 so that the interconnections 11 are separated from each other by apertures. An organic polymer inter-layer insulator 3 is formed by utilizing a thermal polymerization of monomer or oligomer in accordance with the above described novel method of the present invention. The base insulating film 12 has been formed on a semiconductor substrate which is not illustrated. The thermal polymerization process is carried out by use of the apparatus illustrated in FIG. 1. As a result of the thermal polymerization reaction, the organic polymer inter-layer insulator 3 is formed which extends over the interconnections 11 and within the apertures between the interconnections 11 as well as over the base insulating film 12. The apertures between the interconnections 11 are completely filled with the organic polymer inter-layer insulator 3. Since the organic polymer inter-layer insulator 3 is grown by the polymerization reaction, no void nor pin hole is formed.

With reference to FIG. 3B, the organic polymer inter-layer insulator 3 is then subjected to an etch-back so that the organic polymer inter-layer insulator 3 over the interconnections 11 and the base insulating film 12 free of the interconnections are removed, whilst the organic polymer inter-layer insulator 3 remains within the apertures between the interconnections 11 and a side wall of the end interconnection 11.

Figure 4:
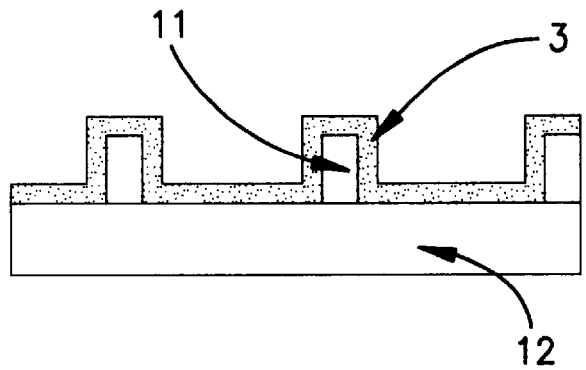
FIG. 4 is a fragmentary cross sectional elevation view illustrative of still another example of the below fourth present invention wherein an organic polymer inter-layer insulator is formed on interconnections and a base insulating film.

FIG. 4 is a fragmentary cross sectional elevation view illustrative of still another example of the above fourth present invention wherein an organic polymer inter-layer insulator is formed on interconnections and a base insulating film.

With reference to FIG. 4, interconnections 11 are formed on a top surface of the base insulating film 12 so that the interconnections 11 are separated from each other at a distance much larger than that of FIGS. 2 and 3A. An organic polymer inter-layer insulator 3 is formed by utilizing a thermal polymerization of monomer or oligomer in accordance with the above described novel method of the present invention. The base insulating film 12 has been formed on a semiconductor substrate which is not illustrated. The thermal polymerization process is carried out by use of the apparatus illustrated in FIG. 1. As a result of the thermal polymerization reaction, the organic polymer inter-layer insulator 3 is formed which extends over the interconnections 11 and on side walls of the interconnections 11 as well as over the base insulating film 12. Since the organic polymer inter-layer insulator 3 is grown by the polymerization reaction, no void nor pin hole is formed.

Figure 5A:
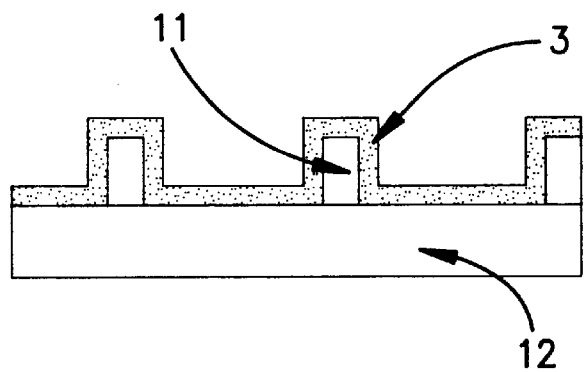
FIGS. 5A and 5B are fragmentary cross sectional elevation views illustrative of yet another example of the below fourth present invention wherein an organic polymer inter-layer insulator is formed on interconnections and a base insulating film.
Figure 5B:
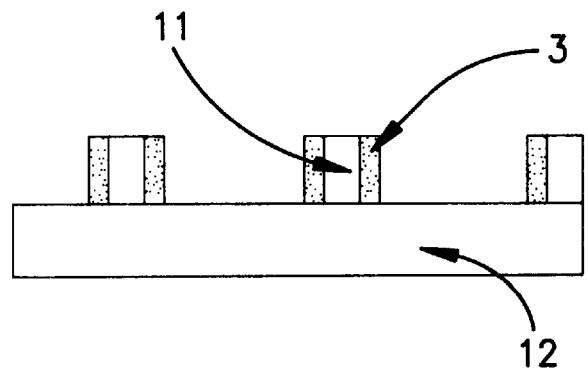

FIGS. 5A and 5B are fragmentary cross sectional elevation views illustrative of yet another example of the above fourth present invention wherein an organic polymer inter-layer insulator is formed on interconnections and a base insulating film.

With reference to FIG. 5A, interconnections 11 are formed on a top surface of the base insulating film 12 so that the interconnections 11 are separated from each other at a distance much larger than that of FIGS. 2 and 3A. An organic polymer inter-layer insulator 3 is formed by utilizing a thermal polymerization of monomer or oligomer in accordance with the above described novel method of the present invention. The base insulating film 12 has been formed on a semiconductor substrate which is not illustrated. The thermal polymerization process is carried out by use of the apparatus illustrated in FIG. 1. As a result of the thermal polymerization reaction, the organic polymer inter-layer insulator 3 is formed which extends over the interconnections 11 and on side walls of the interconnections 11 as well as over the base insulating film 12. Since the organic polymer inter-layer insulator 3 is grown by the polymerization reaction, no void nor pin hole is formed.

With reference to FIG. 5B, the organic polymer inter-layer insulator 3 is then subjected to an etch-back so that the organic polymer inter-layer insulator 3 over the interconnections 11 and over the base insulating film 12 are removed, whilst the organic polymer inter-layer insulator 3 remains on the side walls of the interconnections 11.

Figure 6:
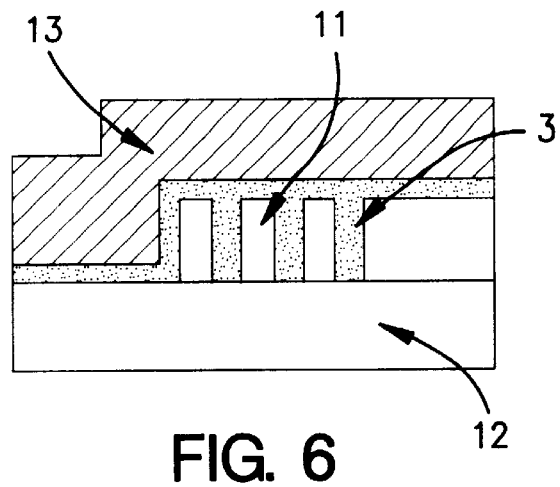
FIG. 6 is a fragmentary cross sectional elevation view illustrative of an example of the method of forming a passivation layer on the organic polymer inter-layer insulator which has already been formed on the interconnections and the base insulating film after the process illustrated in FIG. 2.

FIG. 6 is a fragmentary cross sectional elevation view illustrative of an example of the method of forming a passivation layer on the organic polymer inter-layer insulator which has already been formed on the interconnections and the base insulating film after the process illustrated in FIG. 2.

With reference to FIG. 6, a passivation film 13 made of silicon dioxide is formed on the organic polymer inter-layer insulator 3 which has already been formed on the interconnections 11 and the base insulating film 12 by a chemical vapor deposition, for example, a plasma enhanced chemical vapor deposition, a thermal chemical vapor deposition or a sputtering method.

Figure 7A:
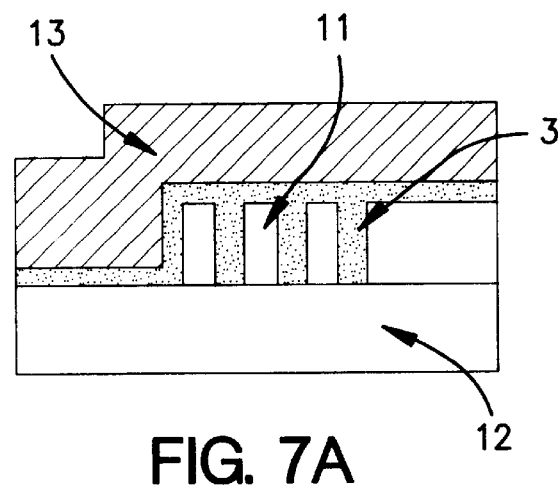
FIGS. 7A and 7B are fragmentary cross sectional elevation views illustrative of an example of the method of forming a passivation layer on the organic polymer inter-layer insulator which has already been formed on the interconnections and the base insulating film after the process illustrated in FIG. 2.
Figure 7B:
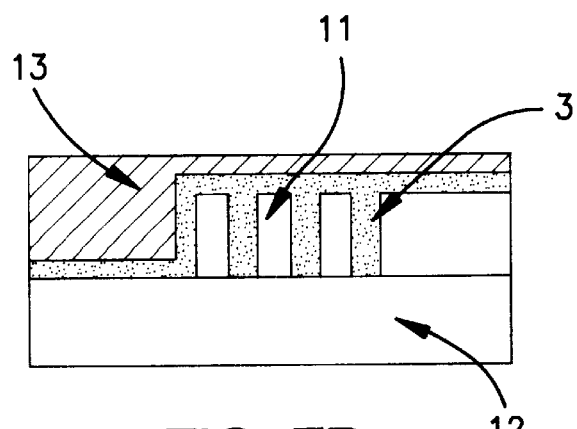

FIGS. 7A and 7B are fragmentary cross sectional elevation views illustrative of an example of the method of forming a passivation layer on the organic polymer inter-layer insulator which has already been formed on the interconnections and the base insulating film after the process illustrated in FIG. 2.

With reference to FIG. 7A, a passivation film 13 made of silicon dioxide is formed on the organic polymer inter-layer insulator 3 which has already been formed on the interconnections 11 and the base insulating film 12 by a chemical vapor deposition, for example, a plasma enhanced chemical vapor deposition, a thermal chemical vapor deposition or a sputtering method.

With reference to FIG. 7B, the passivation film 13 is then subjected to a chemical mechanical polishing for planarization of the passivation film 13. As a result, the passivation film 13 has a top planarized surface.

Figure 8:
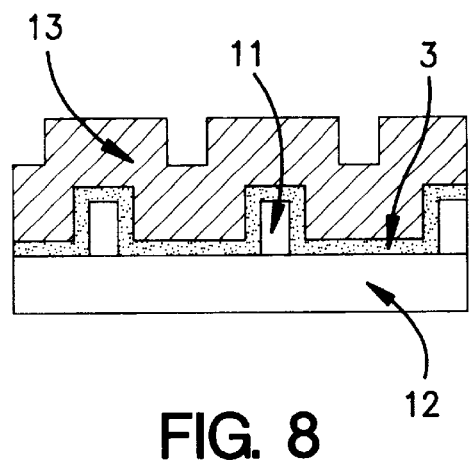
FIG. 8 is a fragmentary cross sectional elevation view illustrative of an example of the method of forming a passivation layer on the organic polymer inter-layer insulator which has already been formed on the interconnections and the base insulating film after the process illustrated in FIG. 4.

FIG. 8 is a fragmentary cross sectional elevation view illustrative of an example of the method of forming a passivation layer on the organic polymer inter-layer insulator which has already been formed on the interconnections and the base insulating film after the process illustrated in FIG. 4.

With reference to FIG. 8, a passivation film 13 made of silicon dioxide is formed on the organic polymer inter-layer insulator 3 which has already been formed on the interconnections 11 and the base insulating film 12 by a chemical vapor deposition, for example, a plasma enhanced chemical vapor deposition, a thermal chemical vapor deposition or a sputtering method.

Figure 9A:
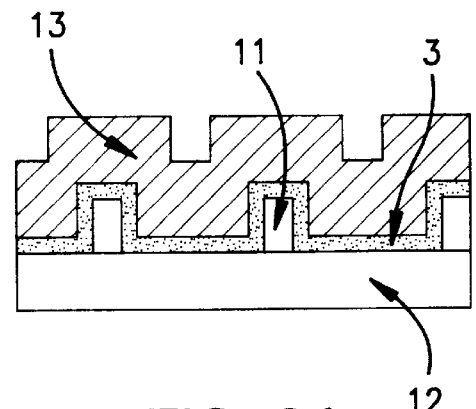
FIGS. 9A and 9B are fragmentary cross sectional elevation views illustrative of an example of the method of forming a passivation layer on the organic polymer inter-layer insulator which has already been formed on the interconnections and the base insulating film after the process illustrated in FIG. 4.
Figure 9B:
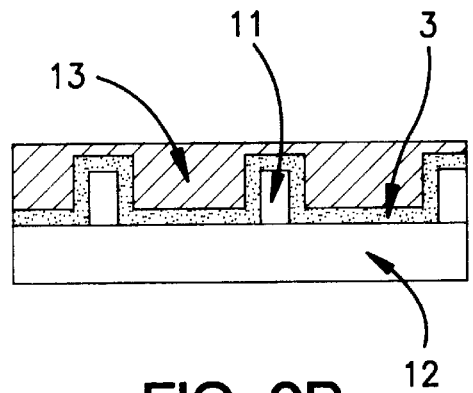

FIGS. 9A and 9B are fragmentary cross sectional elevation views illustrative of an example of the method of forming a passivation layer on the organic polymer inter-layer insulator which has already been formed on the interconnections and the base insulating film after the process illustrated in FIG. 4.

With reference to FIG. 9A, a passivation film 13 made of silicon dioxide is formed on the organic polymer inter-layer insulator 3 which has already been formed on the interconnections 11 and the base insulating film 12 by a chemical vapor deposition, for example, a plasma enhanced chemical vapor deposition, a thermal chemical vapor deposition or a sputtering method.

With reference to FIG. 9B, the passivation film 13 is then subjected to a chemical mechanical polishing for planarization of the passivation film 13. As a result, the passivation film 13 has a top planarized surface.

PREFERRED EMBODIMENTS
First Embodiment:

A first embodiment according to the present invention will be described in detail with reference to FIG. 1. The apparatus of FIG. 1 was used to form an organic polymer inter-layer insulator on a top surface of a semiconductor substrate.

Divinylsiloxane-benzocyclobutene was used as a source for polymerization. Divinylsiloxane-benzocyclobutene was vaporized in the vaporizer 7. This vaporization is carried out by heating divinylsiloxane-benzocyclobutene at a predetermined temperature under a low pressure with a blow of an inert gas, for example, a helium gas. The predetermined temperature was 150° C. for allowing a sufficiently low rate of polymerization reaction of divinylsiloxane-benzocyclobutene in liquid phase. The divinylsiloxane-benzocyclobutene in vapor phase was then fed along with the helium gas through the feeding system 10 into the reaction chamber 9. A measured concentration of divinylsiloxane-benzocyclobutene in vapor phase within the helium gas was 5.43 vol %. On the other hand, a pressure of the reaction chamber 9 was reduced by the discharge system 6 at 10 mTorr. The substrate 4 on the substrate holder 5 with the heater was heated at a temperature of 250° C. When the divinylsiloxane-benzocyclobutene in vapor phase reached on the surface of the substrate 4, a thermal polymerization reaction of divinylsiloxane-benzocyclobutene was caused to form poly-(divinylsiloxane-benzocyclobutene) as an organic polymer insulator. After ten minutes, the substrate 4 was taken out from the reaction chamber 9. A poly-(divinylsiloxane-benzocyclobutene) film 3 as an organic polymer insulating film with a thickness of 1 micrometer was formed on the substrate 4. A measured dielectric constant of the poly-(divinylsiloxane-benzocyclobutene) film 3 was 2.7. It was confirmed that the poly-(divinylsiloxane-benzocyclobutene) film 3 was free of any void and pin hole.

Second Embodiment:

A second embodiment according to the present invention will be described in detail with reference to FIG. 1. The apparatus of FIG. 1 was used to form an organic polymer inter-layer insulator over interconnections formed on a base insulating film and also over a top surface of the base insulating film, where the base insulating film was already been formed on a semiconductor substrate.

With reference again to FIG. 3A, divinylsiloxane-benzocyclobutene was used as a source for polymerization. Divinylsiloxane-benzocyclobutene was vaporized in the vaporizer 7. This vaporization is carried out by heating divinylsiloxane-benzocyclobutene at a predetermined temperature under a low pressure with a blow of an inert gas, for example, a helium gas. The predetermined temperature was 150° C. for allowing a sufficiently low rate of polymerization reaction of divinylsiloxane-benzocyclobutene in liquid phase. The divinylsiloxane-benzocyclobutene in vapor phase was then fed along with the helium gas through the feeding system 10 into the reaction chamber 9. A measured concentration of divinylsiloxane-benzocyclobutene in vapor phase within the helium gas was 5.43 vol %. On the other hand, a pressure of the reaction chamber 9 was reduced by the discharge system 6 at 10 mTorr. The substrate 4 on the substrate holder 5 with the heater was heated at a temperature of 250° C. When the divinylsiloxane-benzocyclobutene in vapor phase reached on the interconnections 11 and the base insulating film 12 over the semiconductor substrate 4, a thermal polymerization reaction of divinylsiloxane-benzocyclobutene was caused to form poly-(divinylsiloxane-benzocyclobutene) as an organic polymer insulator. After ten minutes, the substrate 4 was taken out from the reaction chamber 9. A poly-(divinylsiloxane-benzocyclobutene) film 3 as an organic polymer insulating film with a thickness of 1 micrometer was formed over the interconnections 11 and the base insulating layer 12 as well as within the apertures between the interconnections 11 so that the apertures between the interconnections 11 were filled with the poly-(divinylsiloxane-benzocyclobutene) film 3. A measured dielectric constant of the poly-(divinylsiloxane-benzocyclobutene) film 3 was 2.7. It was confirmed that the poly-(divinylsiloxane-benzocyclobutene) film 3 was free of any void and pin hole.

With reference again to FIG. 3B, the poly-(divinylsiloxane-benzocyclobutene) film 3 was then subjected to an etch-back so that the poly-(divinylsiloxane-benzocyclobutene) film 3 over the interconnections 11 and the base insulating film 12 free of the interconnections are removed, whilst the poly-(divinylsiloxane-benzocyclobutene) film 3 remains within the apertures between the interconnections 11 and a side wall of the end interconnection 11.

Third Embodiment:

A third embodiment according to the present invention will be described in detail with reference to FIG. 1. The apparatus of FIG. 1 was used to form an organic polymer inter-layer insulator over interconnections formed on a base insulating film and also over a top surface of the base insulating film, where the base insulating film was already been formed on a semiconductor substrate.

With reference again to FIG. 3A, divinylsiloxane-benzocyclobutene was used as a source for polymerization. Divinylsiloxane-benzocyclobutene was vaporized in the vaporizer 7. This vaporization is carried out by heating divinylsiloxane-benzocyclobutene at a predetermined temperature under a low pressure with a blow of an inert gas, for example, a helium gas. The predetermined temperature was 150° C. for allowing a sufficiently low rate of polymerization reaction of divinylsiloxane-benzocyclobutene in liquid phase. The divinylsiloxane-benzocyclobutene in vapor phase was then fed along with the helium gas through the feeding system 10 into the reaction chamber 9. A measured concentration of divinylsiloxane-benzocyclobutene in vapor phase within the helium gas was 5.43 vol %. On the other hand, a pressure of the reaction chamber 9 was reduced by the discharge system 6 at 10 mTorr. The substrate 4 on the substrate holder 5 with the heater was heated at a temperature of 250° C. When the divinylsiloxane-benzocyclobutene in vapor phase reached on the interconnections 11 and the base insulating film 12 over the semiconductor substrate 4, a thermal polymerization reaction of divinylsiloxane-benzocyclobutene was caused to form poly-(divinylsiloxane-benzocyclobutene) as an organic polymer insulator. After ten minutes, the substrate 4 was taken out from the reaction chamber 9. A poly-(divinylsiloxane-benzocyclobutene) film 3 as an organic polymer insulating film with a thickness of 1 micrometer was formed over the interconnections 11 and the base insulating layer 12 as well as within the apertures between the interconnections 11 so that the apertures between the interconnections 11 were filled with the poly-(divinylsiloxane-benzocyclobutene) film 3. A measured dielectric constant of the poly-(divinylsiloxane-benzocyclobutene) film 3 was 2.7. It was confirmed that the poly-(divinylsiloxane-benzocyclobutene) film 3 was free of any void and pin hole.

With reference again to FIG. 3B, the poly-(divinylsiloxane-benzocyclobutene) film 3 was then subjected to an etch-back so that the poly-(divinylsiloxane-benzocyclobutene) film 3 over the interconnections 11 and the base insulating film 12 free of the interconnections are removed, whilst the poly-(divinylsiloxane-benzocyclobutene) film 3 remains within the apertures between the interconnections 11 and a side wall of the end interconnection 11.

With reference again to 7A, a plasma enhanced chemical vapor deposition was carried out by use of tetraethyl orthosilicate to form a passivation film 13 made of silicon dioxide with a thickness of 1 micrometer on the poly-(divinylsiloxane-benzocyclobutene) film 3.

Fourth Embodiment:

A fourth embodiment according to the present invention will be described in detail with reference to FIG. 1. The apparatus of FIG. 1 was used to form an organic polymer inter-layer insulator on a top surface of a semiconductor substrate.

Vinylbenzocyclobutene was used as a source for polymerization. Vinylbenzocyclobutene was vaporized in the vaporizer 7. This vaporization is carried out by heating vinylbenzocyclobutene at a predetermined temperature under a low pressure with a blow of an inert gas, for example, a helium gas. The predetermined temperature was 150° C. for allowing a sufficiently low rate of polymerization reaction of vinylbenzocyclobutene in liquid phase. The vinylbenzocyclobutene in vapor phase was then fed along with the helium gas through the feeding system 10 into the reaction chamber 9. A measured concentration of vinylbenzocyclobutene in vapor phase within the helium gas was 5.43 vol %. On the other hand, a pressure of the reaction chamber 9 was reduced by the discharge system 6 at 10 mTorr. The substrate 4 on the substrate holder 5 with the heater was heated at a temperature of 250° C. When the vinylbenzocyclobutene in vapor phase reached on the surface of the substrate 4, a thermal polymerization reaction of vinylbenzocyclobutene was caused to form poly-(vinylbenzocyclobutene) as an organic polymer insulator. After ten minutes, the substrate 4 was taken out from the reaction chamber 9. A poly-(vinylbenzocyclobutene) film 3 as an organic polymer insulating film with a thickness of 1 micrometer was formed on the substrate 4.

It was confirmed that the poly-(vinylbenzocyclobutene) film 3 was free of any void and pin hole.

Fifth Embodiment:

A fifth embodiment according to the present invention will be described in detail with reference to FIG. 1. The apparatus of FIG. 1 was used to form an organic polymer inter-layer insulator on a top surface of a semiconductor substrate.

Vinylbenzocyclobutene dimer was used as a source for polymerization. Vinylbenzocyclobutene dimer was vaporized in the vaporizer 7. This vaporization is carried out by heating vinylbenzocyclobutene dimer at a predetermined temperature under a low pressure with a blow of an inert gas, for example, a helium gas. The predetermined temperature was 150° C. for allowing a sufficiently low rate of polymerization reaction of vinylbenzocyclobutene dimer in liquid phase. The vinylbenzocyclobutene dimer in vapor phase was then fed along with the helium gas through the feeding system 10 into the reaction chamber 9. A measured concentration of vinylbenzocyclobutene dimer in vapor phase within the helium gas was 5.43 vol %. On the other hand, a pressure of the reaction chamber 9 was reduced by the discharge system 6 at 10 mTorr. The substrate 4 on the substrate holder 5 with the heater was heated at a temperature of 250° C. When the vinylbenzocyclobutene dimer in vapor phase reached on the surface of the substrate 4, a thermal polymerization reaction of vinylbenzocyclobutene dimer was caused to form poly-(vinylbenzocyclobutene) as an organic polymer insulator. After ten minutes, the substrate 4 was taken out from the reaction chamber 9. A poly-(vinylbenzocyclobutene) film 3 as an organic polymer insulating film with a thickness of 1 micrometer was formed on the substrate 4.

It was confirmed that the poly-(vinylbenzocyclobutene) film 3 was free of any void and pin hole.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming an organic polymer insulator, said method comprising the step of:

causing a thermal polymerization of at least one kind of monomers and oligomers supplied in vapor phase;

wherein said at least one kind of monomers and oligomers has a first structure capable of having at least two double bonds and a second structure capable of having at least one double bond upon receipt of an energy; and wherein one kind of said monomers and oligomers is polymerized and said one kind of said monomers and oligomers includes both said first structure capable of having at least two double bonds and said second structure capable of having at least one double bond upon receipt of an energy.

2. The method as claimed in claim 1, wherein plural kinds of said monomers and oligomers are polymerized and said plural kinds of said monomers and oligomers include both said first structure capable of having at least two double bonds and said second structure capable of having at least one double bond upon receipt of an energy.

3. The method as claimed in claim 2, wherein a first kind of said monomers and oligomers includes said first structure capable of having at least two double bonds and a second kind of the monomers and oligomers includes said second structure capable of having at least one double bond upon receipt of an energy.

4. The method as claimed in claim 3, wherein said first kind of said monomers and oligomers comprises a diene, and said second kind of said monomers and oligomers comprises a dienophile.

5. The method as claimed in claim 1, wherein said double bond is a conjugated double bond.

6. The method as claimed in claim 5, wherein said monomer is selected from the group consisting of substances having at least one benzocyclobutene structure and derivatives thereof, and said oligomer is obtainable from said monomers.

7. The method as claimed in claim 1, wherein said thermal polymerization is caused at a temperature in the range of 200–400° C.

8. The method as claimed in claim 1, wherein said thermal polymerization is caused under a pressure in the range of 10–1000 mTorr.

9. The method as claimed in claim 1, wherein said thermal polymerization is caused for a time in the range of 30 seconds to 10 minutes.

10. The method as claimed in claim 1, wherein a rate of supplying said at least one kind of monomers and said oligomers in vapor phase is in the range of 0.01 to 1 g/min.

11. A method of forming an organic polymer insulating film on a solid, said method comprising the step of:

supplying at least one kind of monomers and oligomers in vapor phase onto a surface of said solid which is heated so as to cause a thermal polymerization of said at least one kind of monomers and oligomers on said surface of said solid.

12. The method as claimed in claim 11, wherein said at least one kind of monomers and oligomers has a first structure capable of having at least two double bonds and a second structure capable of having at least one double bond upon receipt of an energy.

13. The method as claimed in claim 12, wherein one kind of said monomers and oligomers is supplied in vapor phase for said thermal polymerization thereof, and said one kind of said monomers and oligomers includes both the first structure capable of having at least two double bonds and the second structure capable of having at least one double bond upon receipt of an energy.

14. The method as claimed in claim 12, wherein plural kinds of said monomers and oligomers are supplied in vapor phase for said thermal polymerization thereof, and said plural kinds of said monomers and oligomers include both said first structure capable of having at least two double bonds and said second structure capable of having at least one double bond upon receipt of an energy.

15. The method as claimed in claim 14, wherein a first kind of said monomers and oligomers includes said first structure capable of having at least two double bonds and a second kind of the monomers and oligomers includes said second structure capable of having at least one double bond upon receipt of an energy.

16. The method as claimed in claim 15, wherein said first kind of said monomers and oligomers comprises a diene, and said second kind of said monomers and oligomers comprises a dienophile.

17. The method as claimed in claim 12, wherein said double bond is a conjugated double bond.

18. The method as claimed in claim 17, wherein said monomer is selected from the group consisting of substances having at least one benzocyclobutene structure and derivatives thereof, and said oligomer is obtainable from said monomers.

19. The method as claimed in claim 11, wherein said thermal polymerization is caused at a temperature in the range of 200–400° C.

20. The method as claimed in claim 11, wherein said thermal polymerization is caused under a pressure in the range of 10–1000 mTorr.

21. The method as claimed in claim 11, wherein said thermal polymerization is caused for a time in the range of 30 seconds to 10 minutes.

22. The method as claimed in claim 11, wherein a rate of supplying said at least one kind of monomers and said oligomers in vapor phase is in the range of 0.01 to 1 g/min.

23. The method as claimed in claim 11, wherein said solid comprises a semiconductor.

24. The method as claimed in claim 11, wherein said solid comprises a metal.

25. The method as claimed in claim 11, wherein said solid comprises an alloy.

26. The method as claimed in claim 11, wherein said solid comprises an insulator.

27. The method as claimed in claim 11, wherein said solid comprises a metal silicide.

28. A method of forming an organic polymer insulating film over a substrate which is in one of processes for fabricating a semiconductor device, said method comprising the step of:

supplying at least one kind of monomers and oligomers in vapor phase onto a surface of said substrate which is heated so as to cause a thermal polymerization of said at least one kind of monomers and oligomers on said surface of said substrate.

29. The method as claimed in claim 28, wherein said at least one kind of monomers and oligomers has a first structure capable of having at least two double bonds and a second structure capable of having at least one double bond upon receipt of an energy.

30. The method as claimed in claim 29, wherein one kind of said monomers and oligomers is supplied in vapor phase for said thermal polymerization thereof, and said one kind of said monomers and oligomers includes both the first structure capable of having at least two double bonds and the second structure capable of having at least one double bond upon receipt of an energy.

31. The method as claimed in claim 29, wherein plural kinds of said monomers and oligomers are supplied in vapor phase for said thermal polymerization thereof, and said plural kinds of said monomers and oligomers include both said first structure capable of having at least two double bonds and said second structure capable of having at least one double bond upon receipt of an energy.

32. The method as claimed in claim 31, wherein a first kind of said monomers and oligomers includes said first structure capable of having at least two double bonds and a second kind of the monomers and oligomers includes said second structure capable of having at least one double bond upon receipt of an energy.

33. The method as claimed in claim 32, wherein said first kind of said monomers and oligomers comprises a diene, and said second kind of said monomers and oligomers comprises a dienophile.

34. The method as claimed in claim 29, wherein said double bond is a conjugated double bond.

35. The method as claimed in claim 34, wherein said monomer is selected from the group consisting of substances having at least one benzocyclobutene structure and derivatives thereof, and said oligomer is obtainable from said monomers.

36. The method as claimed in claim 28, wherein said thermal polymerization is caused at a temperature in the range of 200–400° C.

37. The method as claimed in claim 28, wherein said thermal polymerization is caused under a pressure in the range of 10–1000 mTorr.

38. The method as claimed in claim 28, wherein said thermal polymerization is caused for a time in the range of 30 seconds to 10 minutes.

39. The method as claimed in claim 28, wherein a rate of supplying said at least one kind of monomers and said oligomers in vapor phase is in the range of 0.01 to 1 g/min.

40. The method as claimed in claim 28, wherein a surface of said substrate in said process for fabricating said semiconductor includes a semiconductor region, and said organic polymer insulating film is formed on said semiconductor region.

41. The method as claimed in claim 28, wherein a surface of said substrate in said process for fabricating said semiconductor includes a metal region, and said organic polymer insulating film is formed on said metal region.

42. The method as claimed in claim 28, wherein a surface of said substrate in said process for fabricating said semiconductor includes an alloy region, and said organic polymer insulating film is formed on said alloy region.

43. The method as claimed in claim 28, wherein a surface of said substrate in said process for fabricating said semiconductor includes an insulator region, and said organic polymer insulating film is formed on said insulator region.

44. The method as claimed in claim 28, wherein a surface of said substrate in said process for fabricating said semiconductor includes a metal silicide region, and said organic polymer insulating film is formed on said metal silicide region.

45. A method of forming an organic polymer inter-layer insulator over a substrate for a semiconductor device, a surface of said substrate having a base insulating film and a plurality of interconnections extending on said base insulating film, said method comprising the step of:

supplying at least one kind of monomers and oligomers in vapor phase onto said surface of said substrate which is heated so as to cause a thermal polymerization of said at least one kind of monomers and oligomers on said surface of said solid.

46. The method as claimed in claim 45, wherein said at least one kind of monomers and oligomers has a first structure capable of having at least two double bonds and a second structure capable of having at least one double bond upon receipt of an energy.

47. The method as claimed in claim 46, wherein one kind of said monomers and oligomers is supplied in vapor phase for said thermal polymerization thereof, and said one kind of said monomers and oligomers includes both said first structure having at least two double bonds and said second structure having at least one double bond.

48. The method as claimed in claim 46, wherein plural kinds of said monomers and oligomers are supplied in vapor phase for said thermal polymerization thereof, and said plural kinds of said monomers and oligomers include both the first structure capable of having at least two double bonds and the second structure capable of having at least one double bond upon receipt of an energy.

49. The method as claimed in claim 48, wherein a first kind of said monomers and oligomers includes said first structure capable of having at least two double bonds and a second kind of the monomers and oligomers includes said second structure capable of having at least one double bond upon receipt of an energy.

50. The method as claimed in claim 49, wherein said first kind of said monomers and oligomers comprises a diene, and said second kind of said monomers and oligomers comprises a dienophile.

51. The method as claimed in claim 46, wherein said double bond is a conjugated double bond.

52. The method as claimed in claim 51, wherein said monomer is selected from the group consisting of substances having at least one benzocyclobutene structure and derivatives thereof, and said oligomer is obtainable from said monomers.

53. The method as claimed in claim 45, wherein said thermal polymerization is caused at a temperature in the range of 200–400° C.

54. The method as claimed in claim 45, wherein said thermal polymerization is caused under a pressure in the range of 10–1000 mTorr.

55. The method as claimed in claim 45, wherein said thermal polymerization is caused for a time in the range of 30 seconds to 10 minutes.

56. The method as claimed in claim 45, wherein a rate of supplying said at least one kind of monomers and said oligomers in vapor phase is in the range of 0.01 to 1 g/min.

57. The method as claimed in claim 45, wherein a surface of said substrate in said process for fabricating said semiconductor includes a semiconductor region, and said organic polymer insulating film is formed ion said semiconductor region.

58. The method as claimed in claim 45, further comprising a step of subjecting said organic insulating inter-layer insulator to an etch-back to partially remove said organic insulating inter-layer insulator so that a top surface of said organic insulating inter-layer insulator has a level corresponds to top surfaces of said interconnections.

59. The method as claimed in claim 45, further comprising a step of forming a passivation film on said organic insulating inter-layer insulator.

60. A method of forming an organic polymer insulating film over a substrate which is in one of processes for fabricating a semiconductor device, said substrate being placed on a substrate holder with a heater accommodated in a reaction chamber, said method comprising the step of:

vaporizing at least one kind of monomers and oligomers;

feeding said at least one kind of monomers and oligomers which is kept in vapor phase into a reaction chamber; and supplying said at least one kind of monomers and oligomers which is kept in vapor phase onto a surface of said substrate which is heated by said heater so as to cause a thermal polymerization of said at least one kind of monomers and oligomers on said surface of said substrate.

61. The method as claimed in claim 60, wherein said at least one kind of monomers and oligomers has a first structure capable of having at least two double bonds and a second structure capable of having at least one double bond upon receipt of an energy.

62. The method as claimed in claim 61, wherein one kind of said monomers and oligomers is supplied in vapor phase for said thermal polymerization thereof, and said one kind of said monomers and oligomers includes both the first structure capable of having at least two double bonds and the second structure capable of having at least one double bond upon receipt of an energy.

63. The method as claimed in claim 61, wherein plural kinds of said monomers and oligomers are supplied in vapor phase for said thermal polymerization thereof, and said plural kinds of said monomers and oligomers include both said first structure capable of having at least two double bonds and said second structure capable of having at least one double bond upon receipt of an energy.

64. The method as claimed in claim 63, wherein a first kind of said monomers and oligomers includes said first structure capable of having at least two double bonds and a second kind of the monomers and oligomers includes said second structure capable of having at least one double bond upon receipt of an energy.

65. The method as claimed in claim 64, wherein said first kind of said monomers and oligomers comprises a diene, and said second kind of said monomers and oligomers comprises a dienophile.

66. The method as claimed in claim 61, wherein said double bond is a conjugated double bond.

67. The method as claimed in claim 66, wherein said monomer is selected, from the group consisting of substances having at least one benzocyclobutene structure and derivatives thereof, and said oligomer is obtainable from said monomers.

68. The method as claimed in claim 60, wherein a substrate temperature is maintained at a temperature in the range of 200–400° C.

69. The method as claimed in claim 60, wherein a pressure in said reaction chamber is maintained in the range of 10–1000 mTorr.

70. The method as claimed in claim 60, wherein said thermal polymerization is caused for a time in the range of 30 seconds to 10 minutes.

71. The method as claimed in claim 60, wherein a rate of feeding said at least one kind of monomers and said oligomers in vapor phase is maintained in the range of 0.01 to 1 g/min.

* * * * *